(12) United States Patent
Planelle et al.

(10) Patent No.: US 8,448,332 B2
(45) Date of Patent: May 28, 2013

(54) METHOD AND DEVICE FOR TRANSPORTING ELECTRONIC MODULES

(75) Inventors: Philippe Planelle, La Tronche (FR); Rene Monnet, St. Paul D'izeaux (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 143 days.

(21) Appl. No.: 12/864,867

(22) PCT Filed: Jan. 28, 2009

(86) PCT No.: PCT/EP2009/050903
§ 371 (c)(1),
(2), (4) Date: Aug. 10, 2010

(87) PCT Pub. No.: WO2009/095389
PCT Pub. Date: Aug. 6, 2009

(65) Prior Publication Data
US 2010/0325870 A1    Dec. 30, 2010

(30) Foreign Application Priority Data
Jan. 30, 2008 (FR) .................................... 08 50582

(51) Int. Cl.
*H05K 3/30* (2006.01)
(52) U.S. Cl.
USPC .................. 29/832; 29/825; 29/833; 29/846; 438/106
(58) Field of Classification Search
USPC ...................... 29/825, 832, 833, 840; 438/106
See application file for complete search history.

(56) References Cited

U.S. PATENT DOCUMENTS

| | | | |
|---|---|---|---|
| 3,785,507 A | 1/1974 | Wiesler et al. | |
| 3,859,723 A * | 1/1975 | Hamer et al. | 29/840 |
| 4,801,561 A * | 1/1989 | Sankhagowit | 29/827 |
| 5,173,451 A | 12/1992 | Kinsman et al. | |
| 5,203,143 A * | 4/1993 | Gutentag | 53/452 |
| 5,680,699 A * | 10/1997 | Vos | 29/833 |
| 6,319,354 B1 * | 11/2001 | Farnworth et al. | 156/707 |
| 6,356,093 B2 * | 3/2002 | Nishikawa et al. | 324/750.18 |
| 6,433,360 B1 * | 8/2002 | Dosdos et al. | 257/48 |
| 6,505,397 B1 | 1/2003 | Mimata et al. | |
| 6,579,399 B1 * | 6/2003 | Hamren | 156/232 |
| 6,790,710 B2 * | 9/2004 | McLellan et al. | 438/122 |
| 7,151,388 B2 * | 12/2006 | Gopal et al. | 324/750.14 |
| 8,069,636 B1 * | 12/2011 | Gutentag | 53/473 |
| 2004/0093721 A1 | 5/2004 | Watson | |
| 2005/0274003 A1 | 12/2005 | Lee | |

OTHER PUBLICATIONS

International Search Report, International Application No. PCT/EP2009/050903, dated Apr. 21, 2009.

* cited by examiner

*Primary Examiner* — Carl Arbes
(74) *Attorney, Agent, or Firm* — Gardere Wynne Sewell LLP

(57) ABSTRACT

Electronic modules are transported with respect to equipment for manipulating and testing electronic modules. The transport is formed from a thin support having openings for receiving electronic modules. A locating mechanism associated with the thin support serves to locate the support relative to transport and testing equipment. A mechanism is further provided for holding the received electronic modules within the openings during transport and testing.

22 Claims, 5 Drawing Sheets

METHOD AND DEVICE FOR TRANSPORTING ELECTRONIC MODULES

PRIORITY CLAIM

This application is a 371 filing of PCT/EP2009/050903 filed Jan. 28, 2009 which claims priority from French Application for Patent No. 08 50582 filed Jan. 30, 2008, the disclosures of which are hereby incorporated by reference.

TECHNICAL FIELD

The present invention relates to the field of microelectronics, and can relate to a method of testing electronic modules.

BACKGROUND

In connection with the fabrication of integrated circuits, there is a need to perform tests on such circuits. To this end, circuits must be transported along with performance of such testing. Transport equipment is provided for conveying circuits to and from the testing equipment.

SUMMARY

A method of testing electronic modules can comprise a step of producing a thin transporting support having receiving openings and location means, and a step of positioning and holding, through non-permanent gluing means, electronic modules in the receiving openings of the thin support.

A method of testing electronic modules can comprise a step of installation of the thin support on a test equipment by placing at least certain of its positioning locating means with respect to locating means of the test equipment, a step of putting into contact of electrical connection contacts of the electronic modules and contact means of the test equipment connected to an electronic test device, a step of performing the test, a step of separating the electronic modules and the contact means.

A method of testing electronic modules can comprise a step of separation of the electronic modules and the thin transporting support.

According to a test method, the electronic modules can be put in a test position one after the other or in successive groups.

According to a test method, a step of producing a thin transporting support can comprise the production of openings traversing a plate or strip and the sticking of an adhesive face of a non-permanent adhesive tape onto one face of this plate or of this strip and in which the step of positioning and holding the electronic modules comprises the positioning of the electronic modules in the traversing openings and the sticking of these electronic modules onto the adhesive face of the adhesive tape.

According to a test method, a step of positioning and holding the electronic modules can comprise the deposit of a flowable adhesive material in the openings on the adhesive face of the adhesive tape and the positioning of the electronic modules on this adhesive material.

According to a test method, a positioning step can comprise an establishment of an electrical connection of the electronic modules with electrical connection means of the thin support.

According to a test method, a positioning and holding step can comprise a step of establishment of electrical connections by the contact of contacts of the electronic modules with contacts of electrical connection means of the thin support.

An embodiment can relate to a method of transporting electronic modules.

A transporting method can comprise a step of producing a thin transporting support having receiving openings and locating means, and a step of positioning and holding through non-permanent gluing means electronic modules in the receiving openings of the thin support.

According to a transporting method, the step of producing a thin transporting support can comprise the production of traversing openings though a plate or a strip and the sticking of a non-permanent adhesive face of an adhesive tape against a face of this plate or of this strip and in which the step of positioning and holding the electronic modules comprises the positioning of the electronic modules in the traversing openings and the sticking of these electronic modules on the adhesive face of the adhesive tape.

According to a transporting method, the step of positioning and holding of the electronic modules can comprise the deposition of a flowable adhesive material in the openings on the adhesive face of the adhesive tape and the positioning of the electronic modules on this adhesive material.

According to a transporting method, the positioning step can comprise an establishment of an electrical connection of the electronic modules with electrical connection means of the thin support.

According to a transporting method, the positioning and holding step can comprise a step of establishment of electrical connections by contact of contacts of the electronic modules with contacts of electrical connection means of the thin support.

According to a transporting method, the electronic modules can be clamped against at least one wall of the openings.

An embodiment can relate to a device for transporting electronic modules, comprising a thin support having openings for receiving the electronic modules and locating means, this support being provided with non-permanent gluing means for attaching the electronic modules in these openings.

A thin support can comprise a plate or a strip having traversing openings and a non-permanent adhesive holding tape having an adhesive face stuck onto a face of this plate or this strip and able to hold the electronic modules by adhesion.

A thin support can comprise a rigid plate.

A thin support can comprise a strip which is made of a flexible material, undeformable in the plane thereof.

A flowable non-permanent adhesive material can be interposed between the adhesive tape and the electronic modules.

A thin support can comprise electrical connection means.

A thin support can comprise, in its openings, shoulders provided with electrical connection means.

The present invention can relate to an equipment for handling electronic modules.

This equipment can comprise means of receiving at least one thin transporting support having receiving openings and holding means comprising non-permanent gluing means, manipulation means designed to selectively take electronic modules and means of actuating these manipulation means in order to position electronic modules in receiving openings of the thin transporting support and such that these electronic modules are held in these receiving openings by cooperating with holding means carried by this thin transporting support.

In this handling equipment, said means of manipulation can comprise a manipulation or grasping head.

This handling equipment can comprise means of locating the position of the thin transporting support and/or of the electronic modules with respect to said receiving means.

An embodiment can relate to an equipment for testing electronic modules.

This test equipment can comprise means of receiving at least one thin transporting support having receiving openings in which electronic modules are selectively held through non-permanent gluing means, an electrical connection head carrying electrical contact means and means of actuating this electrical connection head in order to selectively place said electrical contact means in contact with electrical connection contacts or balls of the electronic modules and/or of the thin transporting support, and to separate them respectively.

The test equipment can comprise means of locating the position of the thin transporting support and/or of the electronic modules with respect to said receiving means.

BRIEF DESCRIPTION OF THE DRAWINGS

The present invention will now be illustrated, by way of non-limiting examples, through a description of embodiments of electrical bonding pads with reference to the drawings in which.

DETAILED DESCRIPTION OF THE DRAWINGS

Figure 1:
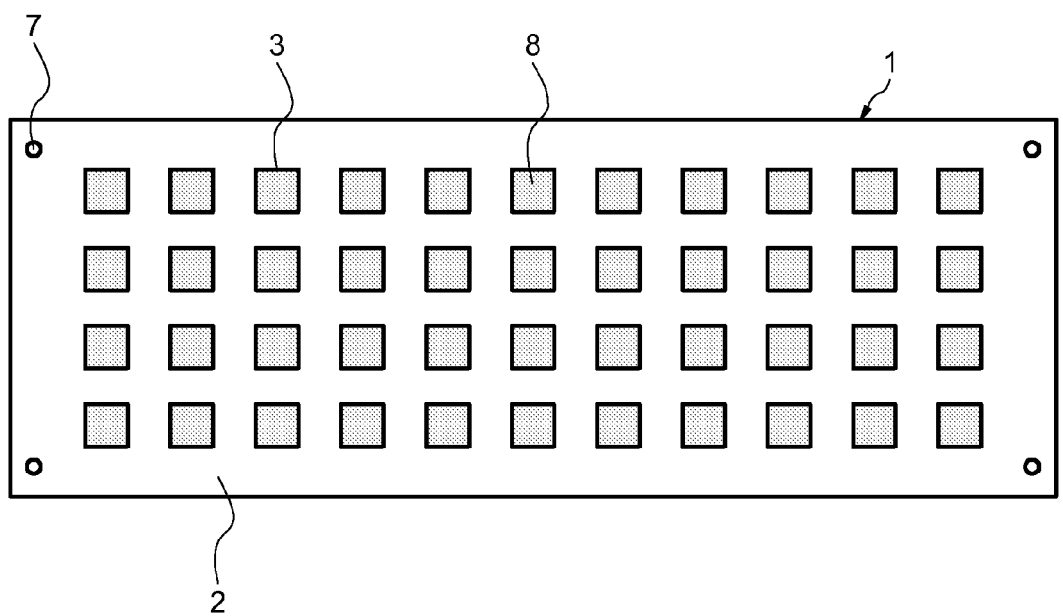
FIG. 1 is a plan view of a transporting support.
Figure 2:
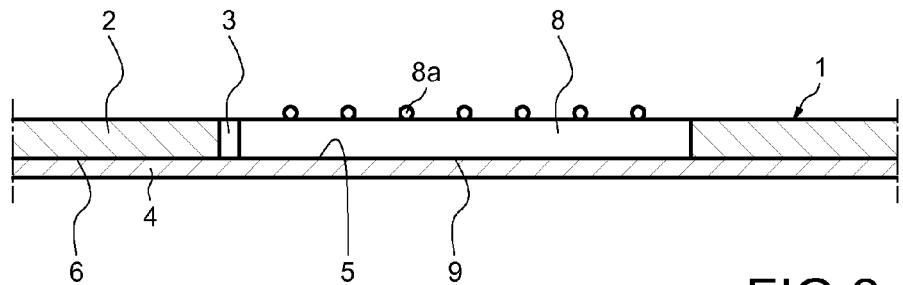
FIG. 2 is a cross-sectional view of a filled transporting support.

Referring to FIGS. 1 to 4, it can be seen that a thin transporting support 1 has been shown, which comprises a longitudinal thin plate 2, for example rectangular, through which are formed receiving openings 3, for example rectangular or square, arranged for example according to a square matrix. The thin plate 2 can be made of a rigid or flexible material, undeformable in the plane of the plate, for example of a metal or of another material such as a plastic material. As illustrated on FIG. 1, receiving openings 3 can be provided aligned on a plurality of longitudinal lines, for example on four longitudinal lines.

The transporting support 1 furthermore comprises non-permanent gluing means such as a thin adhesive tape 4 which has a front face 5 adhering to a rear face 6 of the holed thin plate 2.

The transporting support 1 furthermore has locating holes 7 formed for example in the proximity of its edges, outside of the area in which the openings 3 are formed.

The dimensions of the openings 3 are adapted to be able to each receive in a flat position electronic modules 8, of parallelepipedic shape in this example, having on their front faces electrical connection contacts or balls 8a, such that the rear faces 9 of these modules 8 are against the front face 5 of the adhesive tape 4 and adhere there. The thickness of the thin plate 2 can be adapted to the thickness of the electronic modules 8.

Having, on the one hand, a transporting support 1 and, on the other hand, electronic modules 8 coming from a prior manufacturing and resulting, for example, from a separation into units by sawing, it is possible to position the electronic modules 8 in the openings 3 and hold them by adhesion through non-permanent gluing means, for example automatically by using an equipment.

Figure 3:
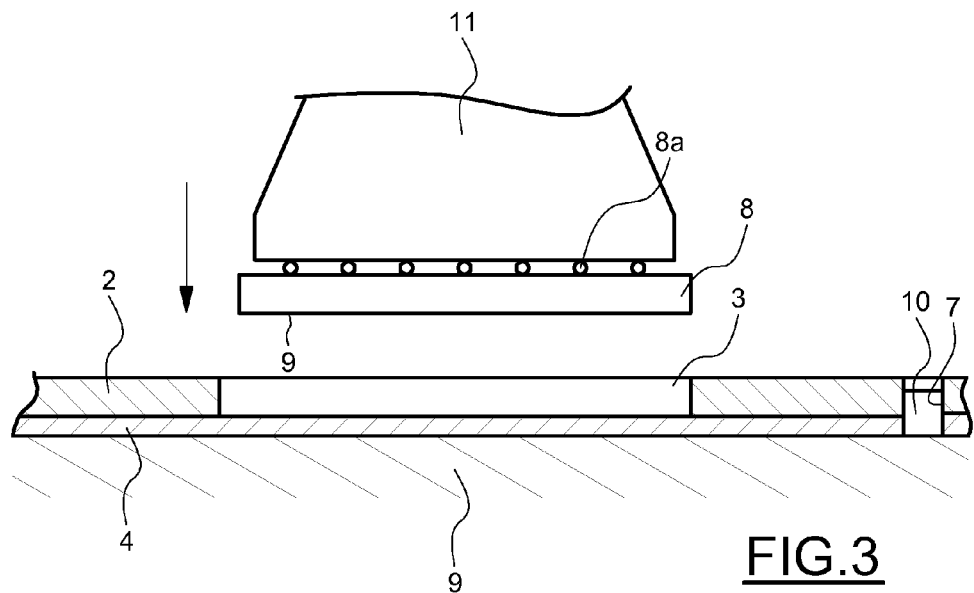
FIG. 3 is a cross-sectional view of a transporting support in the filling position.

As shown in FIG. 3, this manipulation equipment can be adapted to place the transporting support 1 on a receiving table 9 having locating pins 10 which traverse the adhesive tape 4 and are engaged in the locating holes 7 and to actuate a manipulation or grasping head 11 which grips the electronic modules by their front face 9, for example by suction, inserts them, individually or in groups, in the openings 3 and applies them onto the adhesive tape 4 in order to make them adhere, and then releases them. Other locating means could be provided, for example optical means.

Several empty transporting supports 1 can be available in an adapted magazine and transporting supports 1, filled with electronic modules 8, can be placed in another adapted magazine.

Figure 4:
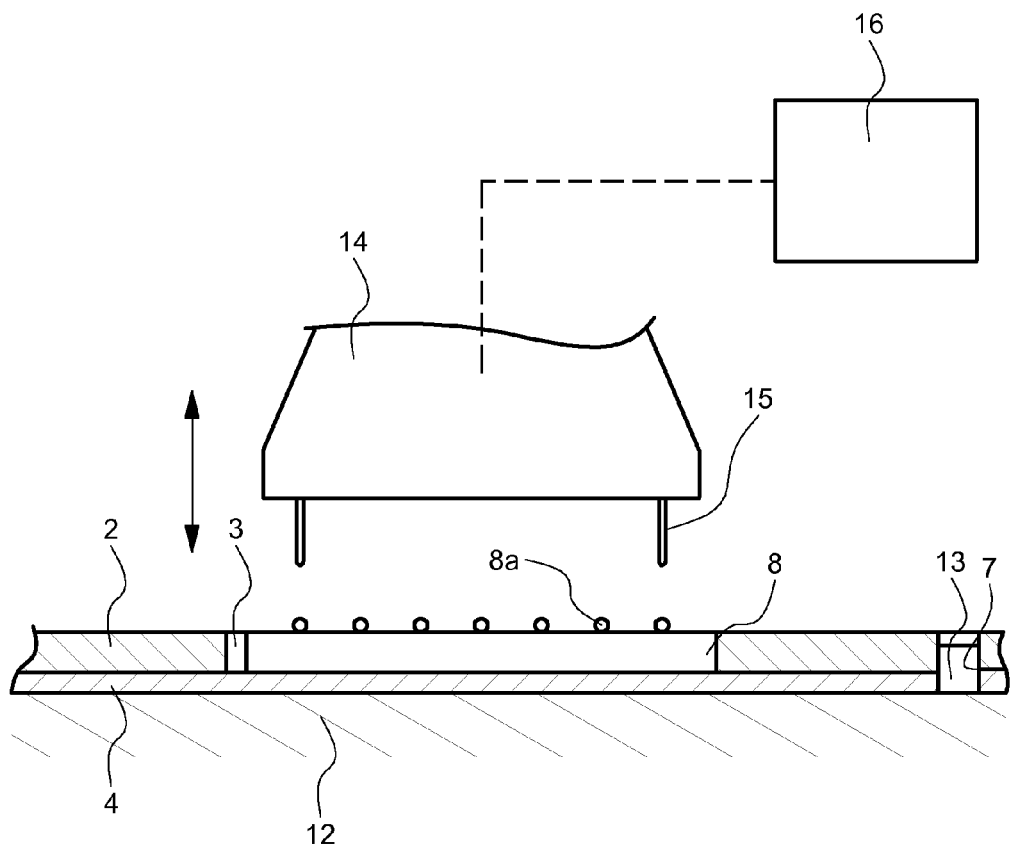
FIG. 4 is a cross-sectional view of a transporting support in the test position.

As shown in FIG. 4, the thin transporting support 1, filled with electronic modules 8, can then be taken towards a test equipment comprising a receiving table 12 having protruding locating pins 13, an electrical connection head 14 situated above and at a distance from that table and having contact fingers 15 extending downwards and an electronic test device 16 connected to the electrical connection head 14.

The transporting support 1 can be installed on the table 12 and placed in a determined position by engaging the protruding locating pins 13 in the locating holes 7 of the thin support 1.

The table 12 and the electrical connection head 14 can then be moved towards each other in order to selectively put into contact electrical test connection contacts or balls 8a and contact fingers 15 and thus to electrically connect the electronic modules 8 with the electronic test device 16, and to be moved away from each other in order to disconnect them.

The electrical connection head 14 can have contact fingers 15 to sequentially and successively allow cycles respectively comprising connection, testing and disconnection of each of the electronic modules 8 carried by the transporting support 1, one after the other, by moving the electrical connection head 14 horizontally with respect to the table 12 between each cycle.

According to another variant, the electrical connection head 14 can have contact fingers 15 to sequentially and successively allow cycles respectively comprising the connection, testing and disconnection of the electronic modules 8 of groups of electronic modules 8, one after the other, by horizontal movement of the electrical connection head 14 with respect to the table 12 between each cycle. It is thus easy to make the numbers and positions of the electronic modules adequate for or correspond with the capabilities of the test equipment.

When the testing of the electronic modules 8 mounted on the transporting support 1 is completed, this support is extracted from the test equipment.

Several transporting supports 1 filled with untested electronic modules 8 can be available in an adapted magazine in order to be individually loaded onto the test equipment and the transporting supports 1 filled with tested electronic modules 8, coming from the test equipment, can be placed in another adapted magazine.

Subsequently, the tested electronic modules 8 can be separated from the transporting support 1 and sorted.

For example, a detaching head can selectively grasp the electronic modules 8 by their front face and place them selectively in another place. According to another example, a push rod can act in the forward direction on the rear face of the adhesive tape 4 or act in the forward direction, through the latter, on the rear face of the electronic modules 8 in order to selectively detach the latter and evacuate them selectively by gravity towards another place.

Figure 5:
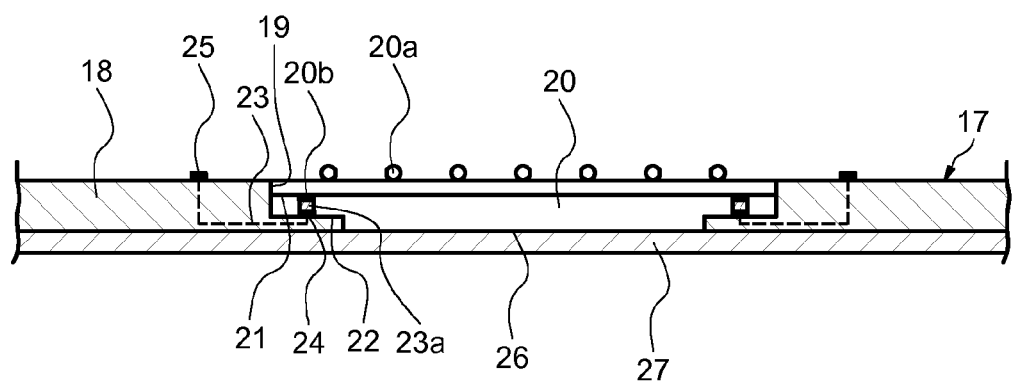
FIG. 5 is a cross-sectional view of another transporting support.

Referring to FIG. 5, it can be seen that a transporting support 17 comprises a thin plate 18, for example a substrate made of plastic, which has openings 19 adapted to receive electronic modules 20 having, in addition to front electrical connection contacts or balls 20a, rear electrical connection contacts 20b formed on a peripheral shoulder 21.

The thin plate 18 has, in its openings 19, peripheral shoulders 22 and has an integrated electrical connection network 23 which selectively connects front electrical connection contacts 24 formed on these shoulders 22 and frontal electrical connection contacts 25 formed on the front face of the thin plate, at a distance from and at the periphery of the openings 19.

As in the preceding example, when the electronic modules 20 are installed in the openings 19 of the thin plate 18, their rear faces 26 are stuck to the front face of an adhesive tape 27, previously stuck to the rear face of the thin plate 20.

Having previously placed balls of an electrically conductive material on at least certain of the contacts 20b and/or of the contacts 24, these balls become compressed in order to form conductive paths 23a between these contacts 20b and 24 respectively, situated facing each other.

The transporting support 17 thus filled with electronic modules 20 can be placed on a test equipment as previously described, whose test head 14 can have electrical contact fingers 15 adapted to selectively come into contact with at least certain of the front contacts 20a of the electronic modules 20 and of the frontal contacts 25 of the thin plate 18.

Figure 6:
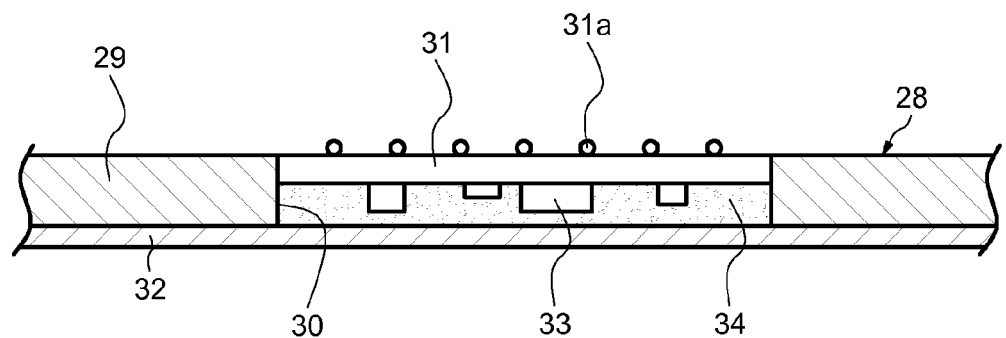
FIG. 6 is a cross-sectional view of another transporting support.

Referring to FIG. 6, it can be seen that another variant embodiment has been shown according to which a transporting support 28 comprises a thin plate 29 which has openings 30 adapted to receive electronic modules 31 and which comprises an adhesive tape 32 stuck onto the rear face of the thin plate 29.

The electronic modules 31 have, on their front face, front electrical connection contacts or balls 31a and, on their rear face, protruding components 33 of different sizes.

The electronic modules 31 are placed in the openings such that their front faces are approximately at the same level as the front face of the thin plate 29 and that the components 33 are at a distance from the adhesive tape 32.

In the spaces formed in the openings 30 of the thin plate 29 and separating the electronic modules 31 from the adhesive tape 33, are forming fixing blocks 34 made from an adhesive, non-permanent gluing material, by the intermediary of which the electronic modules 31 are held.

Figure 7:
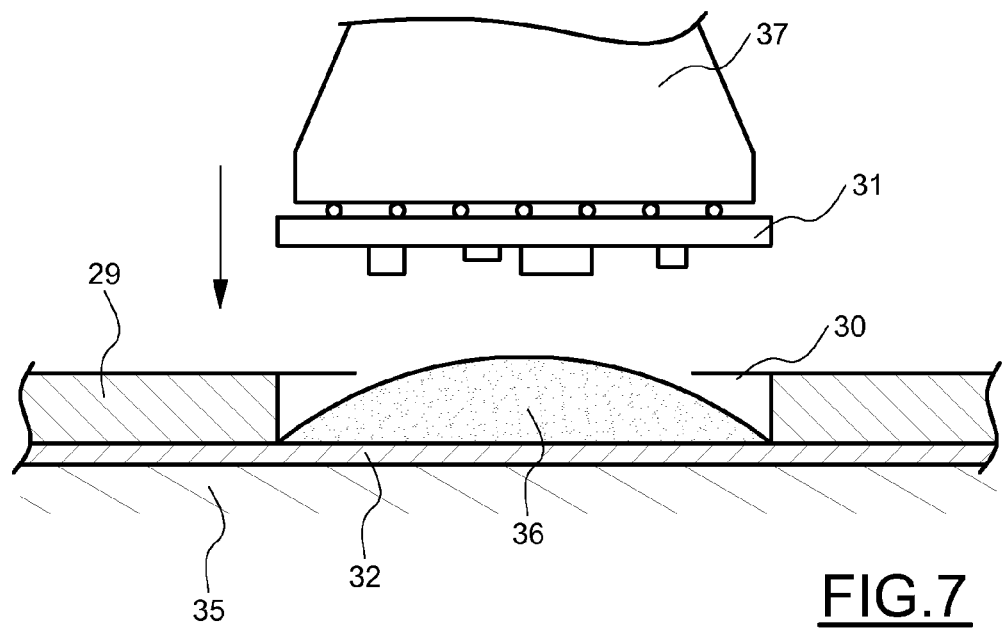
FIG. 7 is a cross-sectional view of this other transporting support in the filling position.

As shown in FIG. 7, in order to produce such an assembly, it is possible to install the thin plate 29 fitted with the adhesive tape 32 on a table 35 of a positioning equipment, to place, from above, flowable drops 36 of said adhesive material, according to adapted volumes, in the bottom of the openings 30, on the adhesive tape, and then, using a positioning head 37, grasp and install the electronic modules 31 in the openings 30. This being done, the electronic modules 31 bear on the drops 36 and spread the adhesive material in order to constitute the holding blocks 34.

As previously described, the transporting support 28 thus filled with electronic modules 31 can be placed on a test equipment as previously described. The transporting support which has been above-described in the examples, can be rigid or flexible. In the case of flexible transporting support, it can be adapted to form relatively long strips able to be rolled and unrolled, even when they are filled with electronic modules.

Such strip can then be unrolled and then rolled in order, between the unrolled and rolled parts, to present flat parts able to be installed on an equipment for placing or removing electronic modules and on a test equipment for testing the electronic modules carried by this flat part. Moreover, such strip can have locating holes 7 distributed over their length in order to be able, by successive incrementations, to place them in successive reference positions on these equipments. The flexible strip being undeformable in the plane thereof, the location of the electronic modules relative to the locating holes 7 is determined when a longitudinal portion of the strip is placed on an equipment and holes cooperate with locating pins 10 of the equipment.

As electronic modules are installed in receiving openings 3 placed on a plurality of longitudinal lines, the operations to do can be performed simultaneously relative to several electronic modules.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

The invention claimed is:

1. A method, comprising:
    positioning and holding electronic modules using an adhesive in a plurality of receiving openings formed in a transporting support having locating openings, wherein positioning further comprises locating each electronic module against at least one internal wall of the receiving opening,
    installing the transporting support on a test equipment by placing position locating structures with respect to locating openings,
    putting electrical connection contacts of the electronic modules into contact with contact fingers of test equipment associated with an electronic test device,
    performing an electronic test,
    separating the contact fingers from the electronic modules, and
    separating the electronic modules from the transporting support.

2. The method according to claim 1, wherein the electronic modules are put in a test position one after the other or in successive groups.

3. The method according to claim 1, further comprising producing the transporting support by producing openings traversing a plate or strip and sticking an adhesive face of an adhesive tape onto one face of this plate or strip,
    wherein positioning and holding the electronic modules comprises the positioning of the electronic modules in the traversing openings and sticking the electronic modules onto the adhesive face of the adhesive tape.

4. The method according to claim 1, wherein positioning and holding the electronic modules comprises depositing a flowable adhesive material in the receiving openings and positioning of the electronic modules on this adhesive material.

5. The method according to claim 1, wherein positioning comprises establishing an electrical contact between the electronic modules and an electrical connection path provided with the transporting support.

6. The method according to claim 1, wherein positioning and holding comprises establishing an electrical connection through contact of the electronic module with a contact provided for electrical connection with the transporting support.

7. The method according to claim 1, wherein locating each electronic module against at least one internal wall of the receiving opening comprises clamping the electronic module against the at least one internal wall of the receiving opening.

8. A method, comprising:
positioning and holding electronic modules in receiving openings of a transporting support using an adhesive, wherein positioning and holding the electronic modules comprises: depositing an adapted volume of a flowable adhesive material in each opening and positioning the electronic module on this adhesive material, wherein the adapted volume of a flowable adhesive material has a volume sufficient to completely fill a volume within the opening between the received electronic module and side walls and floor of the receiving opening.

9. A method, comprising:
positioning and holding electronic modules in receiving openings of a transporting support using an adhesive, wherein positioning further comprises locating each electronic module against at least one internal wall of the receiving opening, the transporting support having locating openings; and
wherein positioning further comprises establishing an electrical connection of the electronic modules with electrical connectors provided on the transporting support.

10. The method according to claim 9, further comprising producing the transporting support with openings traversing through a plate or a strip and sticking of an adhesive face of an adhesive tape against a face of this plate or strip, and
wherein positioning and holding the electronic modules further comprises positioning the electronic modules in the openings and sticking of these electronic modules on the adhesive face of the adhesive tape.

11. A method, comprising:
positioning and holding electronic modules in receiving openings of a transporting support using an adhesive, the transporting support having locating openings; and
wherein positioning and holding comprises: locating each electronic module against at least one internal wall of the receiving opening and establishing an electrical connection between the electronic modules and contacts provided on the transporting support.

12. The method according to claim 11, wherein locating each electronic module against at least one internal wall further comprises clamping the electronic module against the at least one internal wall of the receiving opening.

13. A system, comprising:
electronic modules;
a device for transporting the electronic modules comprising a support having openings for receiving the electronic modules, the support further having locating openings, the support further being provided with an adhesive for attaching the electronic modules within the openings, wherein each electronic module is located against at least one internal wall of the opening; and
contact fingers of test equipment in contact with electrical connection contacts of the electronic modules.

14. The system according to claim 13, wherein the support comprises a plate or a strip having openings traversing therethrough and an adhesive holding tape having an adhesive face stuck onto a face of this plate or strip which holds received electronic modules in the openings by adhesion.

15. The system according to claim 13, wherein the support comprises a rigid plate.

16. The system according to claim 13, wherein the support comprises a flexible strip.

17. The system according to claim 13, wherein the support further comprises electrical connections for making electrical contact with a received electronic module.

18. The system according to claim 17, wherein the support comprises, in its openings, shoulders that are provided with the electrical connections.

19. A system, comprising: a device for transporting electronic modules comprising a support having receiving openings for receiving electronic modules, the support further having locating openings, the support further being provided with an adhesive for attaching the electronic modules within the receiving openings, the support further being provided with an adapted volume of a flowable adhesive provided within each receiving opening, wherein the adapted volume of a flowable adhesive has a volume sufficient to completely fill a volume within the receiving opening between the received electronic module and side walls and floor of the receiving opening.

20. Equipment for testing electronic modules, comprising:
at least one transporting support having receiving openings configured to hold using an adhesive electronic modules to be tested against at least one internal wall of the receiving openings,
an electrical connection head carrying electrical contacts, and
an actuator configured to actuate the electrical connection head and selectively place said electrical contacts into electrical contact with electrical connection contacts or balls provided on the electronic modules.

21. The equipment according to claim 20, further comprising locating openings for locating a position of the transporting support including electronic modules with respect to said transporting support.

22. Equipment for testing electronic modules, comprising:
at least one transporting support having receiving openings configured to hold using an adhesive electronic modules to be tested against at least one internal wall of the receiving openings,
an electrical connection head carrying electrical contacts, and
an actuator configured to actuate the electrical connection head and selectively place said electrical contacts into electrical contact with the transporting support wherein the transporting support includes electrical connections with the electronic modules.

* * * * *